(12) United States Patent
Savonen

(10) Patent No.: US 11,041,828 B2
(45) Date of Patent: Jun. 22, 2021

(54) COIL ARRANGEMENT FOR SAMPLE MEASUREMENT WITH A SPATIALLY VARIABLE MAGNETIC FIELD

(71) Applicant: MAGNASENSE TECHNOLOGIES OY, Vantaa (FI)

(72) Inventor: Markus Savonen, Rajamäki (FI)

(73) Assignee: MAGNASENSE TECHNOLOGIES OY, Vantaa (FI)

( * ) Notice: Subject to any disclaimer, the term of this patent is extended or adjusted under 35 U.S.C. 154(b) by 468 days.

(21) Appl. No.: 15/127,021

(22) PCT Filed: Mar. 20, 2015

(86) PCT No.: PCT/FI2015/050190
§ 371 (c)(1),
(2) Date: Sep. 17, 2016

(87) PCT Pub. No.: WO2015/140411
PCT Pub. Date: Sep. 24, 2015

(65) Prior Publication Data
US 2017/0108467 A1    Apr. 20, 2017

(30) Foreign Application Priority Data
Mar. 21, 2014  (FI) .................................... 20145267

(51) Int. Cl.
*G01N 27/74* (2006.01)
*B03C 1/033* (2006.01)
(Continued)

(52) U.S. Cl.
CPC ......... *G01N 27/745* (2013.01); *B03C 1/0335* (2013.01); *B03C 1/288* (2013.01);
(Continued)

(58) Field of Classification Search
CPC ............... G01N 27/745; G01N 27/023; G01N 35/0098; B03C 1/0335; B03C 1/288; B03C 2201/18; G01R 33/0213; G01R 33/1276
See application file for complete search history.

(56) References Cited

U.S. PATENT DOCUMENTS

| 4,255,711 A | 3/1981 | Thompson |
| 5,793,199 A | 8/1998 | Kasahara et al. |

(Continued)

FOREIGN PATENT DOCUMENTS

| CN | 1159582 A | 9/1997 |
| CN | 1624447 A | 6/2005 |

(Continued)

OTHER PUBLICATIONS

Misron, Norhisam, et al. "Effect of inductive coil shape on sensing performance of linear displacement sensor using thin inductive coil and pattern guide." Sensors 11.11 (2011): 10522-10533.*

(Continued)

*Primary Examiner* — Robert J Eom
(74) *Attorney, Agent, or Firm* — FisherBroyles, LLP; Robert Kinberg

(57) ABSTRACT

The invention relates to a measuring arrangement comprising: a coil arrangement for creating a magnetic field to measure a sample to be arranged in connection with it including at least one flat coil, the coil geometry of which is arranged to be changed in the direction of the plane defined by the coil arrangement, in order to create a spatially changing magnetic field having a known distance dependence for measuring the sample; and electronics connected to the coil arrangement for creating a magnetic field using the coil arrangement; and means for changing the position of the sample and the coil arrangement relative to each other in order to change the magnetic field affecting the sample and (Continued)

having the known distance dependence. In addition, the invention also relates to a method for measuring a sample.

19 Claims, 8 Drawing Sheets

(51) Int. Cl.
    *G01R 33/02* (2006.01)
    *B03C 1/28* (2006.01)
    *G01N 27/02* (2006.01)
    *G01R 33/12* (2006.01)
    *G01N 35/00* (2006.01)

(52) U.S. Cl.
    CPC ....... *G01N 27/023* (2013.01); *G01R 33/0213* (2013.01); *G01R 33/1276* (2013.01); *B03C 2201/18* (2013.01); *G01N 35/0098* (2013.01)

(56) References Cited

U.S. PATENT DOCUMENTS

| | | | |
|---|---|---|---|
| 2001/0052769 A1* | 12/2001 | Simmonds | B82Y 15/00 324/204 |
| 2005/0202572 A1 | 9/2005 | Seki et al. | |
| 2005/0284817 A1 | 12/2005 | Fernandez et al. | |
| 2007/0042506 A1 | 2/2007 | Bangert | |
| 2008/0186018 A1 | 8/2008 | Anderson | |
| 2009/0243603 A1 | 10/2009 | Makiranta et al. | |
| 2010/0094587 A1 | 4/2010 | Mysore et al. | |
| 2010/0109686 A1 | 5/2010 | Zhe et al. | |
| 2013/0121879 A1 | 5/2013 | Kawabata et al. | |

FOREIGN PATENT DOCUMENTS

| | | |
|---|---|---|
| CN | 103361270 A | 10/2013 |
| EP | 0658764 A1 | 6/1995 |
| EP | 0773440 A1 | 5/1997 |
| JP | 05-264556 A | 10/1993 |
| JP | 33-77348 B2 | 2/2003 |
| JP | 2004-530896 A | 10/2004 |
| JP | 2005-257425 A | 9/2005 |
| JP | 38-31771 B2 | 10/2006 |
| JP | 2009-534641 A | 9/2009 |
| JP | 2010-534320 A | 11/2010 |
| JP | 46-57552 B2 | 3/2011 |
| WO | 96/07090 A1 | 3/1996 |
| WO | 97/41445 A1 | 11/1997 |
| WO | 01/40790 A1 | 6/2001 |
| WO | 2012/162869 A1 | 12/2012 |
| WO | 2013/059692 A1 | 4/2013 |

OTHER PUBLICATIONS

International Search Report for PCT/FI2015/050190, dated Sep. 8, 2015.
Written Opinion for PCT/FI2015/050190, dated Sep. 8, 2015.
International Preliminary Report on Patentability for PCT/FI2015/050190, dated Mar. 2, 2016.
EP Search Report, dated Oct. 19, 2017, for corresponding EP Application No. 15 76 4309.9.
Office Action dated Sep. 4, 2018 in Chinese Patent Application No. 201580015280.6 (submitted with English translation).
Office Action dated Jan. 29, 2019 in Japanese Patent Application No. 2016-555823 (English translation only).

* cited by examiner

COIL ARRANGEMENT FOR SAMPLE MEASUREMENT WITH A SPATIALLY VARIABLE MAGNETIC FIELD

CROSS-REFERENCE TO RELATED APPLICATIONS

This application is a U.S. National Stage Application of International Patent Application No. PCT/FI2015/050190, filed Mar. 20, 2015, which claims benefit of Finland Patent Application No. 20145267, filed Mar. 21, 2014.

TECHNICAL FIELD

The present invention relates to a measuring arrangement, which includes
 a coil arrangement arranged to create a magnetic field in order to measure a sample to be arranged in connection with it,
 electronics connected to the coil arrangement for creating a magnetic field using the coil arrangement.
The invention also relates to a method for measuring a sample.

BACKGROUND OF THE INVENTION

Needs are known to analyse, for example, various samples, in which there are, for example, magnetic particles. The magnetic particles can either, for example, belong to the sample itself, and/or have been added to it for analysis. Generally, it can be said that the sample to be analysed includes substances, which influence the measuring arrangement, and from which conclusions can be drawn on this basis. Some examples of the measurement of samples are the number of magnetic particles in the sample, their size, bonding and/or distribution in the various parts of the sample volume. Various kinds of measuring arrangement are also known, in which there is a coil arrangement and electronics connected to it, for measuring the sample.

For example, U.S. Pat. No. 4,651,092 discloses a solution based on wrapped coils. In it the sample is placed inside the coil for measuring. The distance sensitivity of such a coil is, however, only limited. If the size and/or number of the particles, or the size of the sample is sufficiently small, reliable measurement results cannot be obtained by using the measuring arrangement.

So-called scanning measurements, in which a coil arrangement is also utilized, are widely known. In these, a coil acting as a sensor is moved in the depth direction of the sample. It is therefore also possible to refer to the scanning of the sample. Because the distance between the coil structure and the sample changes during the measurement, this makes difficult, for example, the stabilization of the static magnetic field in the measurement zone.

SUMMARY OF THE INVENTION

The present invention is intended to create a measuring arrangement, which is simple in implementation and, in addition, improves the measurement sensitivity. According to an embodiment of the invention there is provided a measuring arrangement including: a coil arrangement for creating a magnetic field to measure a sample to be arranged in connection with the coil arrangement, the coil arrangement including at least one flat coil, having a coil geometry of arranged to be changed in a direction of a plane defined by the coil arrangement in order to create a spatially changing magnetic field having a known distance dependence for measuring the sample; electronics connected to the coil arrangement for creating a magnetic field using the coil arrangement; and means for changing the position of the sample and the coil arrangement relative to each other in order to change the magnetic field affecting the sample and having the known distance dependence.

According to another embodiment of the invention there is provided a method for measuring a sample, comprising steps of: providing a coil arrangement comprising at least one flat coil having a coil geometry changing in a direction of a plane defined by the coil arrangement for creating a spatially changing magnetic field having a known distance dependence for measuring a sample; and measuring the sample using the coil arrangement by changing a position of the sample and the coil arrangement relative to each other in order to change the magnetic field acting on the sample and having the known distance dependence; and detecting a change in an impedance of the coil arrangement, on the basis of which qualitative or quantitative properties of the sample are determined.

By means of the measuring arrangement, for example, the number and/or distribution of the magnetic particles in the sample can be determined simply and easily. In the invention, one or more flat coils belonging to the coil arrangement are utilized.

Owing to the invention, the geometry of the magnetic field created by the coil arrangement can be exploited to determine, for example, the particle distribution of the sample. The measurement signal can then depend on the distance between the magnetic sample and the coil. The magnetic particles close to the coil in the sample volume cause a greater measurement signal than the magnetic particles farther from the coil in the sample volume. Different particle distributions can have different distances from the particles to the coil, in which case the effect on the electrical properties of the coil will be different, even though the total particle number is constant. Through the invention, it is therefore possible to determine, for example, the precipitation of the particles in a sample and the relative proportions in the sample of particles with different densities.

The distance dependence can be adjusted, for example, by means of the geometry of the coil. By changing the location of the sample relative to the coil, or altering the geometry of the coil, different areas of the sample can be measured. Thus, by means of the same measuring arrangement it is possible to determine, for example, the total number and distribution of the particles in the sample.

The invention is not restricted to any specific measurement technique. However, it can be stated in general that the invention can be based on a change in the impedance of the coil arrangement. Thus, any way of measuring whatever based on the properties of the coil (for example, measurement of the impedance) can be utilized in the measuring arrangement according to the invention. Some examples of these are impedance bridge and resonance-frequency measurements.

Owing to the invention, it is also possible to avoid the great precision demands of many other known manners of measurement. One of these is, for example, the symmetricality requirement of gradiometric measurement. Because the sample either need not be moved, or it can be moved, for example on the same plane relative to the coil arrangement, the invention also permits the use of a static magnetic field in the precipitation of the particles, without this affecting the actual measurement. The coil structure and the sample can then be the whole time at the same distance from each other.

In addition, the manner of measurement based on the geometry of the magnetic field also permits, through the invention, there to be no need to move the coil in the depth, i.e. in the longitudinal direction of the sample. Within certain conditions, movement of the sample is not needed at all, such as, for example, in the case of a previously known total number of particles. Then, because the sensitivity of the coil arrangement at its various measurement points is known, the particle distribution in the sample can be ascertained by making the sample approach the coil arrangement at one known measurement point. Other characteristic features and advantages of the invention may be appreciated from the following detailed description considered in conjunction with the accompanying drawings.

BRIEF DESCRIPTION OF THE DRAWINGS

The invention, which the embodiments presented hereinafter in no way restrict, is described in greater detail with reference to the accompanying figures, in which.

DETAILED DESCRIPTION OF THE INVENTION

Figure 1A:
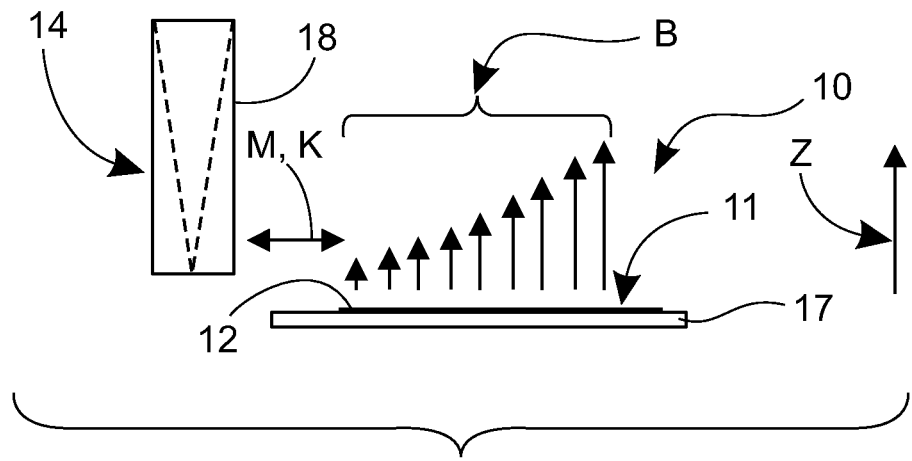
FIG. 1a shows a schematic example of the measuring arrangement, seen from the side.
Figure 1B:
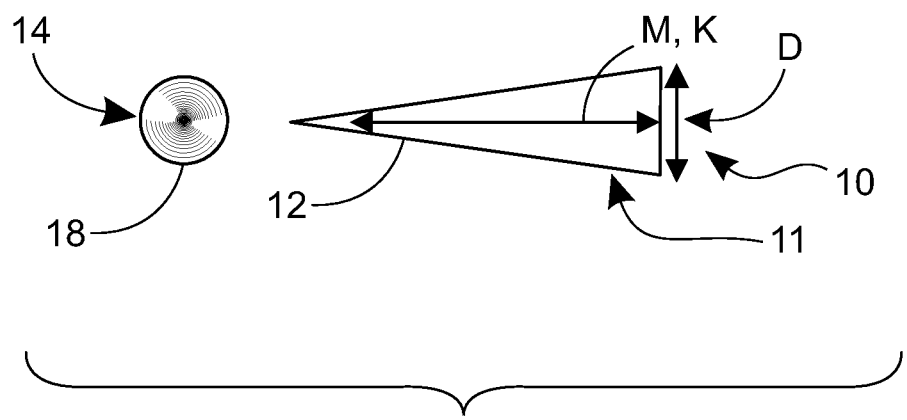
FIG. 1b shows a top view of the measuring arrangement shown in FIG. 1a, FIG. 2a shows a second schematic example of the measuring arrangement, seen from the side.

FIGS. 1a and 1b show a first example of a schematic construction of the measuring arrangement 10, seen from different directions. FIG. 1a shows the arrangement 10 seen from the side and FIG. 1b seen from above.

Figure 3:
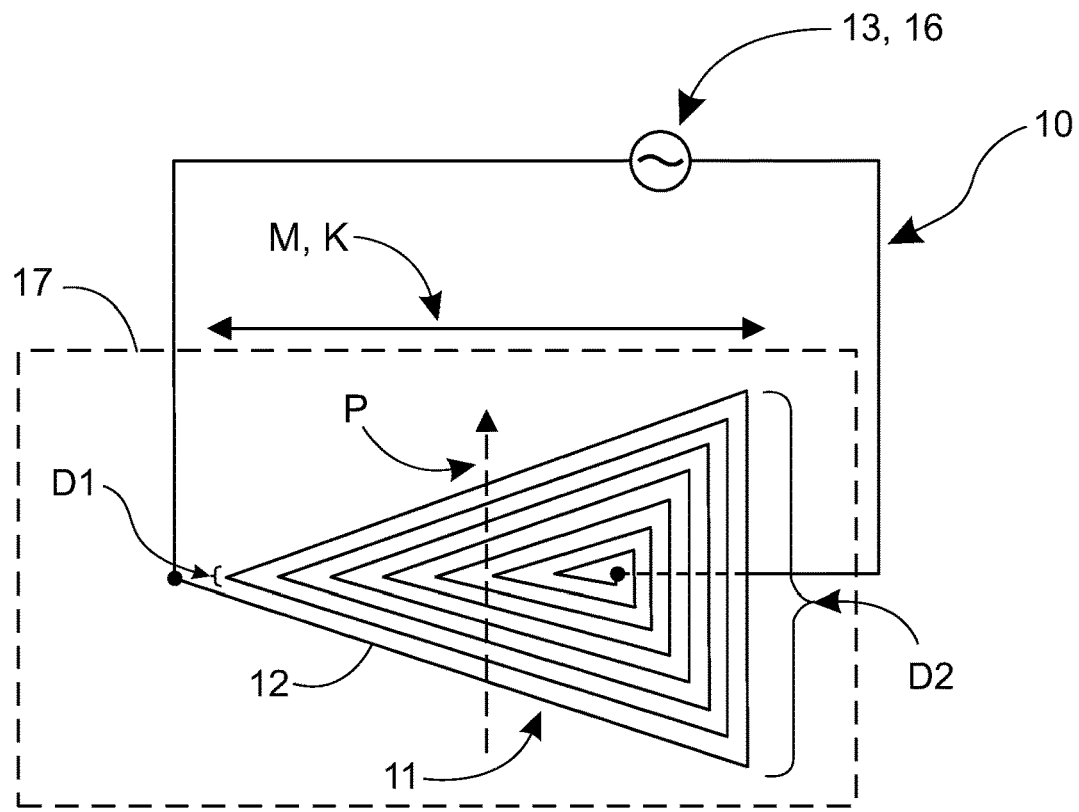
Figure 11:
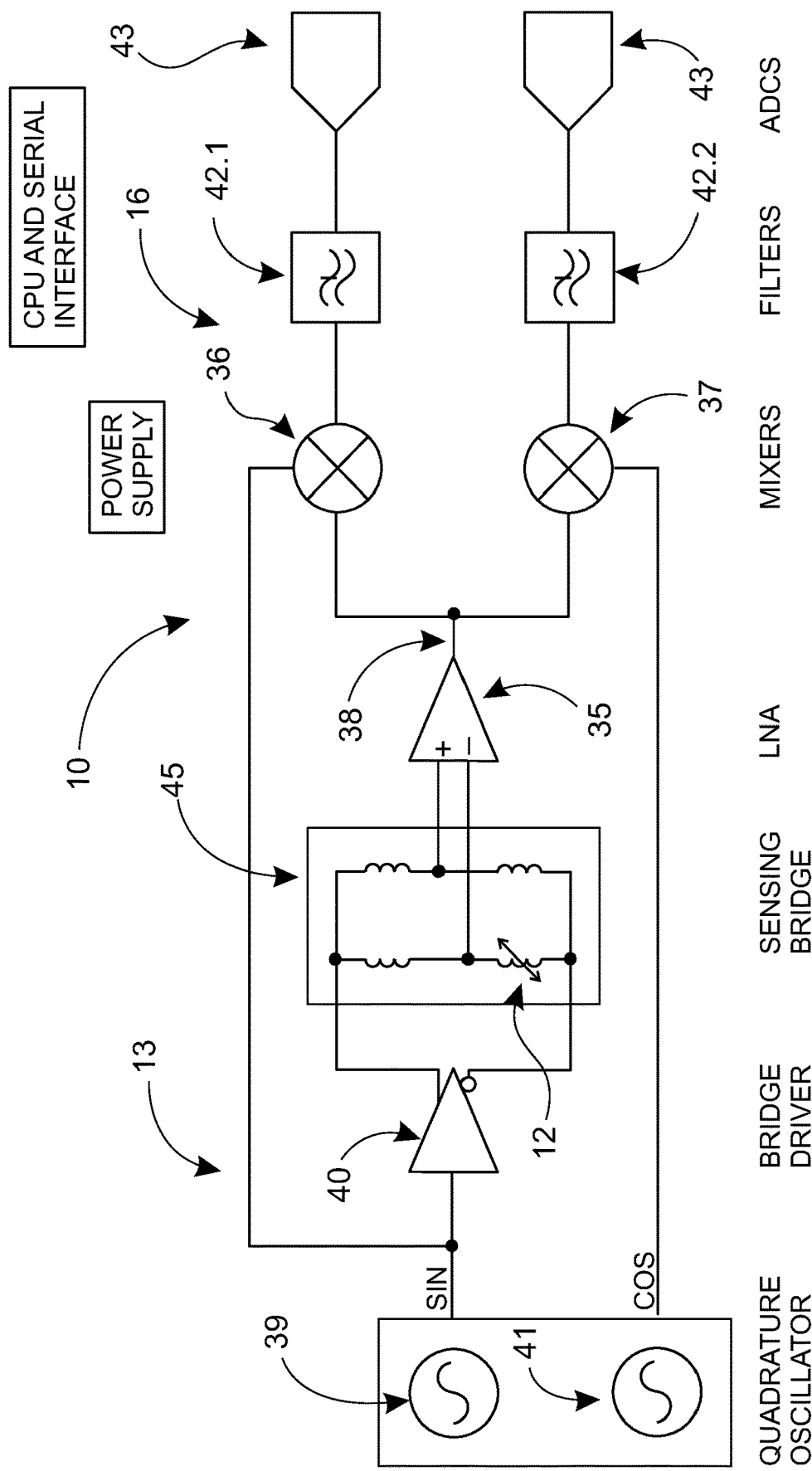
FIG. 11 shows an example, as a block diagram, of the implementation of the electronics arranged in connection with the measuring arrangement.

The measuring arrangement 10 can be an independent device unit, or part of some larger apparatus totality, such as, for example, an analyser. In one device, that can be at least one measuring arrangement 10. In its basic form, the measuring arrangement 10 can include, for example, a coil arrangement 11 and electronics for performing measurement using the coil arrangement 11. The electronics 13, 16 can be connected to the coil arrangement 11 (FIGS. 3 and 11). The coil arrangement 11 is arranged to create a magnetic field B, in order to measure a sample 14 to be arranged in connection with the coil arrangement. In FIG. 1a, the magnetic field is shown schematically by arrows, which are equipped with the reference B, pointing upwards from the coil arrangement 11.

The coil arrangement 11 can include at least one flat coil 12. The electronics 13 are connected to the coil arrangement 11, in this case to at least one flat coil 12, in order to create at least a magnetic field B using the coil arrangement 11 and to perform the measurement. The measurement can be based on one or more changes, caused by the sample 14, taking place in the electrical (and/or magnetic) properties of the coil arrangement 11. In turn, there can be, for example, magnetic particles in the sample 14. The particles can be bound to the other constituents of the sample 14, or not be bound to them. The magnetic particles of the sample 14 cause a change in the properties of the coil arrangement 11. For example, in the field of diagnostics, one can also refer to magnetic labels.

Figure 4:
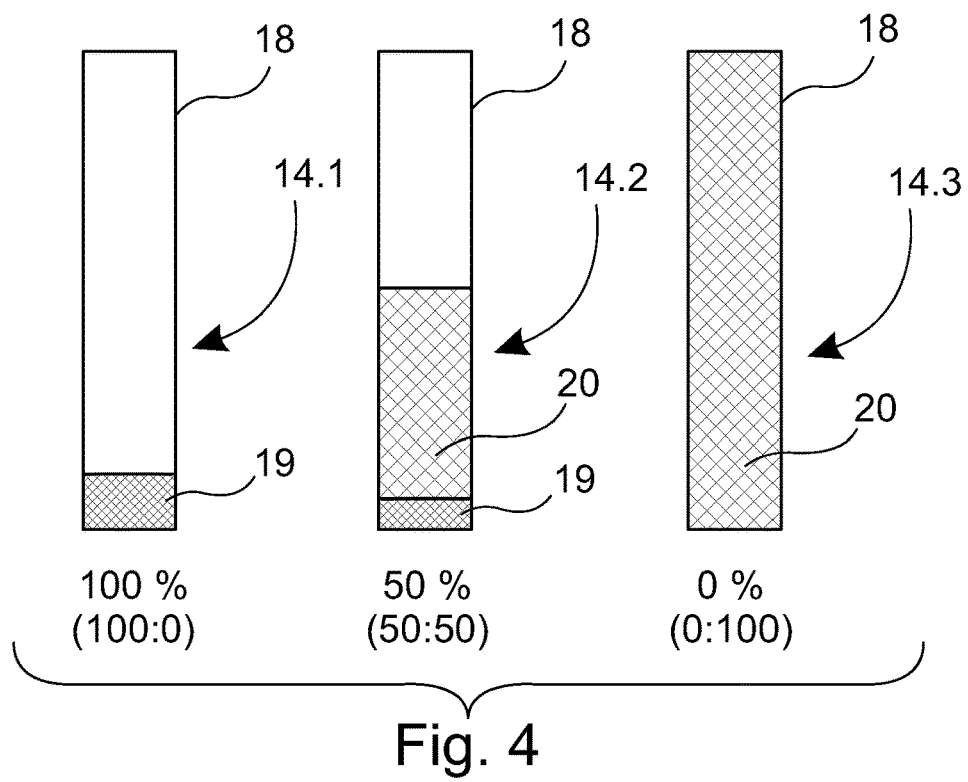
FIG. 4 shows examples of various samples.
Figure 5:
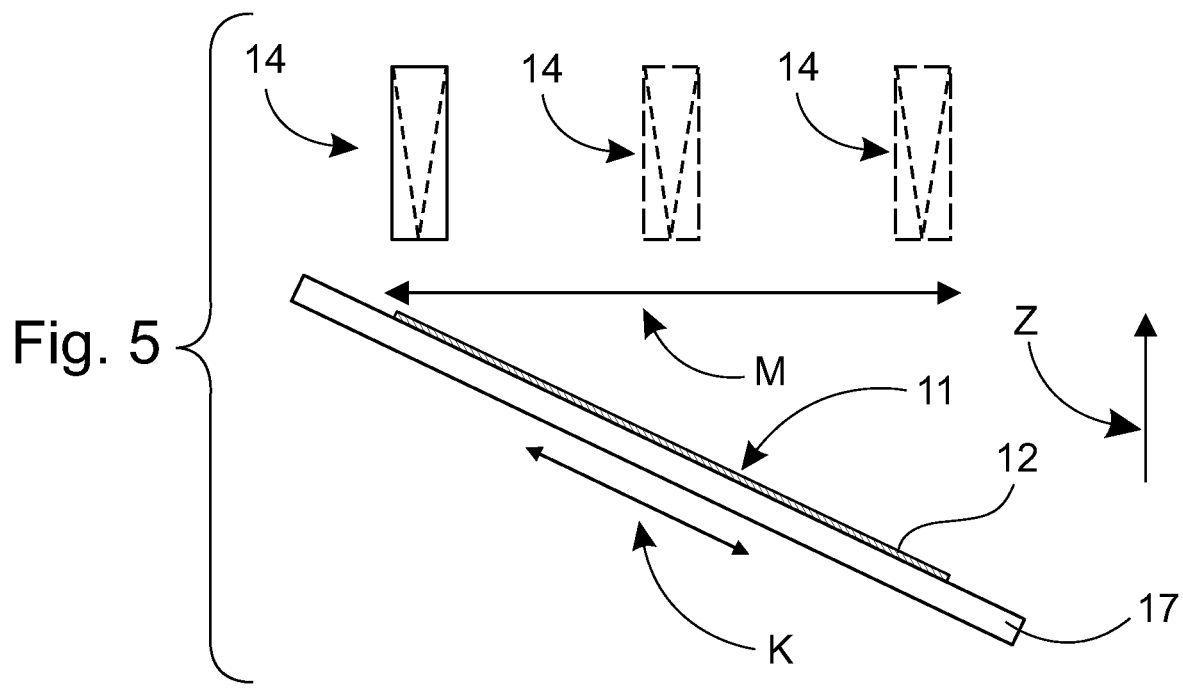
FIG. 5 shows a third schematic example of the measuring arrangement, seen from the side.

In this case, a cuvette 18 represents the sample 14. In the cuvette 18, there can be an analyte for analysis and magnetic particles (FIG. 4). The magnetic particles can be bound, for example, to reagents. The reagents can react with the analyte in an, as such, known manner. The cuvette 18 can be, for example, a downwardly narrowing, for example, conical tube, the cross-section of which can be, for example, circular. Equally, the substances and materials being examined by means of the arrangement 10 can also be in some other kind of measurement base than a cuvette 18. The measurement base can thus be understood very widely in connection with the invention. The sample can also be understood widely in connection with the invention. It can be a small part of a larger totality, or equally also the totality in itself, without some part of it being separated for analysis.

The coil geometry of the at least one flat coil 12 belonging to the coil arrangement 11 is arranged to create a spatially changing magnetic field for the measurement of the sample 14. In other words, the shape and especially the extent of the magnetic field created by the coil arrangement 11 can change in an established manner between the different points of the coil arrangement 11. The different points of the area of effect of the coil arrangement 11, in which the magnetic field changes in a set manner, form the measurement area for the sample 14. The sample 14 is in the measurement area when a measurement is being performed on it. If the change and strength of the magnetic field at different points of the coil arrangement 11 (for example in the direction M) is known, things can be measured from the sample 14, for example, from different parts of its volume.

According to one embodiment, the position of the sample 14 and the coil arrangement 11 relative to each other is arranged to be changeable, in order to change the magnetic field affecting the sample 14. For this purpose, the arrangement 10 includes means 24 for changing the position of the sample 14 and the coil arrangement 11 relative to each other. Several possibilities exist for implementing this. The position of the sample 14 can be changed relative to a coil arrangement 11 arranged permanently in the arrangement 10, the position of the coil arrangement 11 can be changed relative to the sample 14 arranged permanently in the arrangement 10, or the position of both can be changed relative to each other. In order to achieve the changes, the measuring arrangement 10 can include corresponding mechanisms (for example, stepper motors, path-of-motion elements, and a holder 25 for at least one sample 14). The movements can also be performed manually.

The means 24 for changing the position of the sample 14 and the coil arrangement 11 relative to each other can also include a location sensor (or similar). By means of it, the location of the sample 14 at any time relative to the coil arrangement 11 can be found out. More generally, one can also refer to means 15 for determining the location of the sample 14 relative to the coil arrangement 11. For example, the stepper motor 34 (FIG. 7) can act as a location sensor, in which case the property is built into it.

According to one embodiment, a spatially changing magnetic field can be created by means of one or several flat coils 12 belonging to the coil arrangement 11. The coil geometry of at least one flat coil 12 belonging to the coil arrangement 11 is arranged to change in the direction K of the plane defined by the coil arrangement 11, in order to create a spatially changing magnetic field B for measuring the sample 14. In FIGS. 1a and 1b, the triangle in the plane presents schematically a planar measuring coil. The flat coil 12 can be arranged in a known manner, for example, on the surface of a circuit board 17. One exemplary way to implement this is a flat coil 12, the coil geometry of which changes in the measurement area in the (measurement) direction M, in which the position of the sample 14 and the coil 12 relative to each other is arranged to change. Here, the measurement direction M is now the same as the direction K defined by the characteristic plane of the flat coil 12. The position of the sample 14 and the coil arrangement 11 relative to each other is arranged to be changed in the measurement direction M, i.e. in the direction K of the characteristic plane defined by the coil arrangement 11.

One example of a change in the coil geometry is a change in the width D of the coil figure in the measurement direction. In this case, the measurement direction is also the direction K of the characteristic plane of the flat coil 12. The measurement direction is shown in the figures by the arrow M and the principle of a change in the extent of the magnetic field achieved by the flat coil 12 is shown by the arrow B. Thus, in this embodiment measurement is based on the distance sensitivity depending on the dimensions of the measurement area formed of the coil 12 (now the width D of the coil figure). The sample 14 can be moved over the coil 12 in the measurement direction M, for example, on the same plane as the coil 12. The sample 14 then moves on one side of the coil 12 and the coil's 12 electrical properties can be influenced by the sample 14 from the direction Z, which can be the same direction, in which the different particle layers are. This too, for its part, improves, for example, the accuracy of the spatial distribution definition (i.e. the definition of the location of the particles in the sample volume).

Figure 2A:
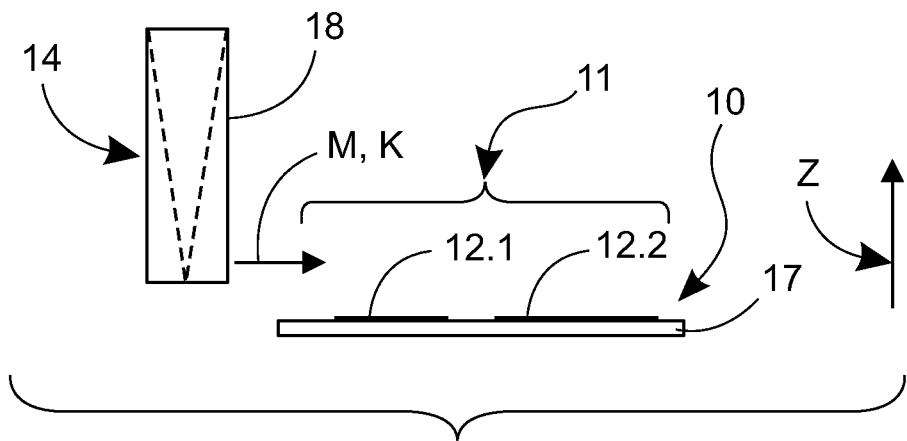
FIG. 2b shows a top view of the measuring arrangement shown in FIG. 2a, FIG. 3 shows a schematic example of a flat-coil seen from above of measuring arrangement.
Figure 2B:
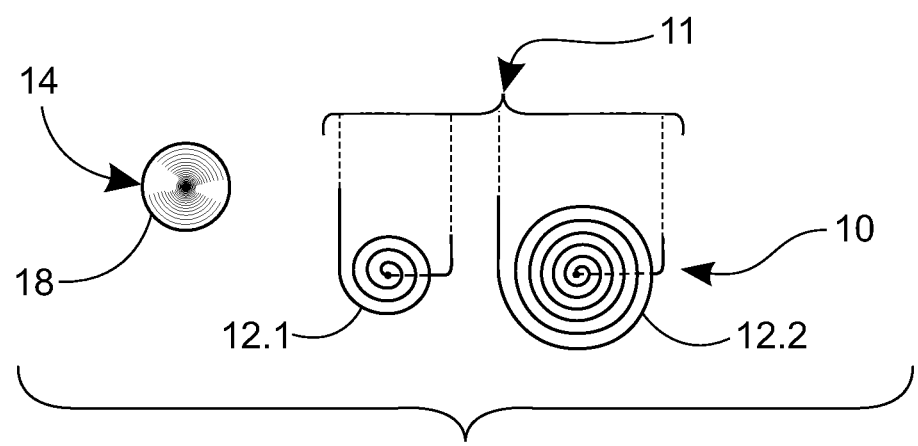

In FIGS. 2a and 2b, as in FIGS. 1a and 1b, another way is shown of creating a spatially changing magnetic field. According to this embodiment, instead of one wedge-like coil 12, the coil figure of which expands in the measurement direction M, the coil arrangement 11 can be arranged to include at least two flat coils 12.1, 12.2, which have coil geometries differing at least partly from each other. The coils 12.1, 12.2 are now spiral coils. The coils 12.1, 12.2 can then have different diameters. In the measurement area, in the measurement direction M there can first of all be a narrower flat coil 12.1, which is followed in the measurement direction M by a wider flat coil 12.2, both being on the same circuit board 17. The coil 12.1 with the smaller diameter measures the particles closer to the coil 12.1 in the sample 14 and the larger coil 12.2 following it also measures the particles in the sample 14 farther away relative to the coil 12.2.

In other words, when the cuvette 18 is again moved from left to right in the measurement direction M, the measurement area (the dimension of the magnetic field B) of the coil arrangement 11 increases again in the depth, i.e. the longitudinal direction Z of the cuvette 18. This direction Z is, in the case according to the embodiment of FIGS. 1 and 2, perpendicular to the main direction of the flat coil 12, 12.1, 12.2 and the direction of movement M of the sample 14. In the embodiment of FIGS. 2a and 2b, measurement can be performed, for example, at two measurement points in the coil arrangement 11. The first measurement point can be in the centre of the spiral coil 12.1 with a smaller diameter and the second measurement point in the centre of the spiral coil 12.2 with a larger diameter.

If the sample 14 is moved, this movement can be made owing to the flat coils 12, 12.1, 12.2, on the same plane as the coils. In other words, the distance of the cuvette 18 from the flat coil 12, 12.1, 12.2 does not necessarily change. Using a wedge-like coil 12 according to FIGS. 1a and 1b, for example, the total number of particles and the particle distribution can be determined from the sample 14 by means of a single scanning over the coil arrangement 11. Because the scanning can take place on the same plane, the use of this solution can avoid the drawbacks of the prior art. The invention permits, for example, an easy standardization of the static magnetic field in the measurement area, which is explained somewhat later in this application.

FIG. 3 shows a schematic example of a flat coil and the electronics 13 connected to it. Here, the flat coil 12 belonging to the coil arrangement 11 is wedge-like, so that the coil figure widens in the measurement direction M, i.e. its area increases. The electronics 13 include means for creating a magnetic field using the coil arrangement 11 and, in addition, also means 16 for reading the sample 14. When reading the sample 14, a change can be detected in the impedance of the coil arrangement 11, which is caused by the sample 14 and particularly the magnetic particles in it.

According to one embodiment, the means 16 for reading the sample 14 can be arranged to be formed at least partly from the same electronics by which the magnetic field is created. This substantially simplifies the implementation of the electronics of the arrangement 10. In FIG. 3, the functionality shown by the reference number 13, 16 can be, in principle, a phase-locked signal source, which in an as such known manner seeks to continuously home on a resonance. Another possibility is to arrange the coil arrangement 11 to form part of an impedance bridge, as shown in the embodiment of FIG. 11. The change caused by the sample 14 in the properties of the coil arrangement 11 can be detected even from only a change in current.

FIG. 3 also shows an example of the dimensions of the wedge-like coil 12. Its length in the measurement direction M can be, for example, 15-50 mm, the width D1 of the coil figure at the narrow end of the coil 12 can be, for example, 1-2 mm, and the width D2 at the wide end of the coil 12 can be, for example, 5-15 mm, such as 10 mm. Generally, the dimensions of the coil 12 can depend, for example, on the thickness of the sediment layer of the sample 14 and the distance of the sample 14 from the coil 12. The coil's 12 winding width can be, for example, 50-200 µm, such as 100 µm. The windings' insulating gap can, in turn, also be, for example, 50-200 µm, such as 100 µm.

Generally, it can be stated that the coil geometry of the at least one flat coil 12 belonging to the coil arrangement 11 can be asymmetrical. FIG. 3 shows an example of this. In the cases according to the embodiments shown, the coil geometry is asymmetrical relative to the line P perpendicular to the direction K of the plane defined by the coil arrangement 11. In this case, the line P is on the same plane as the measurement direction M and, in addition, also as the direction K of the characteristic plane defined by the coil arrangement 11. If this line P were to be, for example, in a triangular flat coil 12, for instance, in the measurement direction M in the centre of the flat coil 12, then the coil geometry is narrower on the left-hand side of the line P and wider on the right-hand side. In other words, the coil geometry of the coil arrangement 11 is asymmetrical relative to this line P. Even more particularly, the width of the coil figure is asymmetrical relative to this line P.

Correspondingly, the distance of the cuvette 18 from the coil arrangement 11 can also vary. The cuvette 18 can even make contact with the coil 12. Examples of the distance can be 0-10 mm, such as, for example, 5 mm. Though the distance of the cuvette 18 from the coil 12 can vary even in an individual measurement, it can, however, be known in any event.

The arrangements 10 according to the embodiment suit extremely well the measurement of a sharp-pointed cuvette 18, because its aligning relative to the coil arrangement 11 can be especially challenging. The measuring of a cuvette 18 and aligning it relative to the coil arrangement 11 will easily succeed using a wedge-like coil arrangement 11 according to FIG. 1 and spiral coils 12.1, 12.2 according to FIG. 2.

If several measuring coils 12.1, 12.2 are used, the same thing can be implemented using different geometries, for example, in such a way that one coil 12.1 has a greater distance dependence than the other coil 12.2. The number of particles in the whole sample volume, and separately the number of particles at a specific point in the sample 14, are thus defined.

Figure 7:
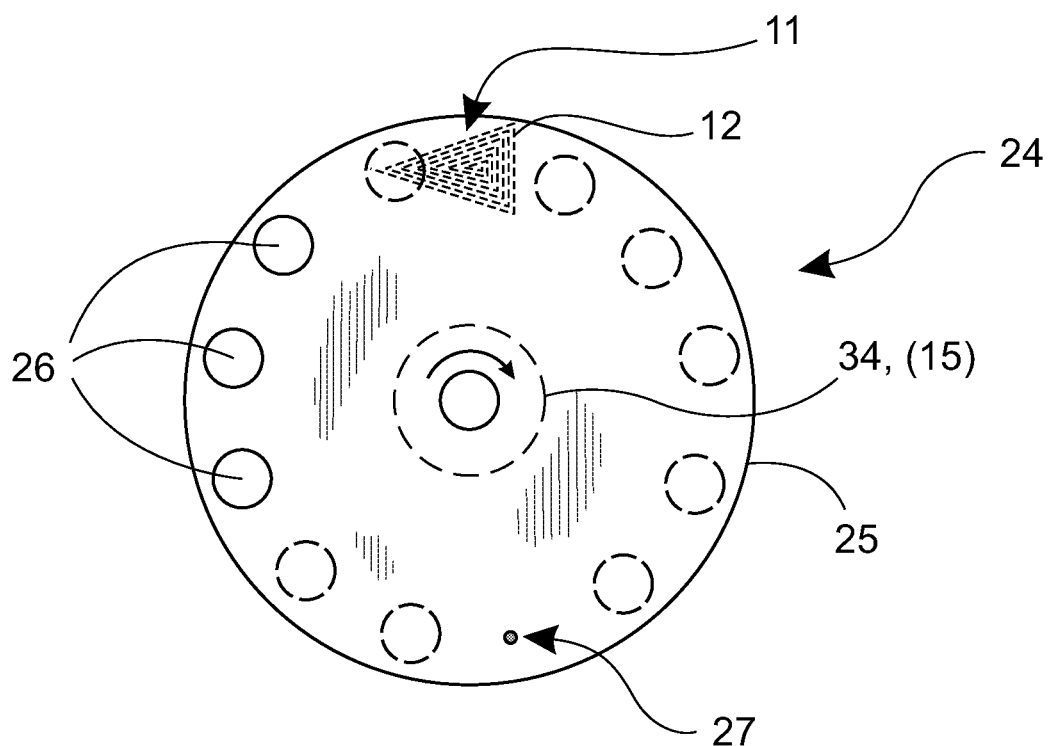
FIG. 7 shows schematically an example of the arrangement of samples in connection with the coil arrangement, seen from above.

The arrangement 10 can be calibrated in the depth, i.e. the longitudinal direction Z of the sample 14, for example, using a point-like sample (reference number 27 in FIG. 7). One way to calibrate the arrangement 10 is to set the signal given by each measurement point located in the plane direction M of the coil arrangement 11 to be the same. Then, if all the particles being measured are in a thin layer on the bottom of the cuvette 18 (near to the coil's 12, 12.1, 12.2 surface), the signal obtained from each measurement point will be the same. If the particles are in a thick layer, which is distributed more evenly in the sample volume defined by the cuvette 18, the signal obtained will increase according to the movement of the cuvette 18 over the coil arrangement 11 from the narrow end towards the wide end (in the embodiment of FIGS. 1a, 1b, and 3).

If the geometry of the cuvette 18 is simplified to become a cylindrical piece, the effect of the thick of the sedimented layer in the cuvette 18 can be depicted by a simple integral of the surface of the coil. The greater the difference between the measurement points at the narrowest and widest ends of the coil 12, the thicker will be the sedimented layer in the cuvette 18.

According to one embodiment, the arrangement 10 can also be used to distinguish two sediment layers with different densities from each other. If the diameter of the coil 12 is sufficiently large, the entire number of particles in the volume is measured by placing the sample 14 on a set measurement point at the widest end of the coil arrangement 11. A layer that is densely sedimented on the bottom of the sample 14 gives a nearly constant signal while being moved, but a layer on top changes the result. If the sensitivity's distance dependence function is known for each measurement point, the thicknesses of both layers can be decided on the basis of the results. In this embodiment, one possibility for performing the calibration is to first of all make one measurement using a point-like sample 14 and then a second measurement using an evenly distributed sample 14. Another alternative is to make several calibration measurements using point-like samples at different distances.

In terms of its measuring electronics, the invention is thus not restricted to anything particular. The ways can be based on a change in the electrical properties of the coil, such as, for example, its impedance, which take place when the magnetic particles enter the coil's measurement area. Thus, measurement can be based, for example, on a changes in the resonance frequency, or on impedance-bridge measurement, or on other appropriate ways.

FIG. 4 shows some schematic examples of the different samples 14.1-14.3. Here, the sample is depicted as being sedimented as one or more layers in the cuvette 18. The diameter of the cuvette 18 can be, for example, 2 mm. FIG. 4 shows cuvettes 18, in which there are two different kinds of particles 19, 20. The negative sample 14.1, in which there are only magnetic particles 19, is the farthest left of the samples. The positive sample 14.3, in which each magnetic particle 20 is also bound to a larger non-magnetic particle, is the farthest right of the samples. In this sample 14.3, the density of the magnetic material 20 is considerably less than that of the first sample 14.1.

In the centre of FIG. 4, a sample 14.2 is shown, half of which is mere magnetic particles 19 (on the bottom of the cuvette 18) and half magnetic particles 20, to which a larger non-magnetic particle is also bound. These are above the particle layer 19 on the bottom of the cuvette 18. The density of the denser particles 19 on the bottom of the cuvette 18 can be, for example, ten times greater than that of the other particles 20 bound to a non-magnetic particle. The total number of particles is now assumed to be constant. In this example illustrating the situation, merely the denser particles 19 on the bottom of the cuvette 18 have a particle sediment of about 0.95 mm (about 3 mm$^3$ volume). The volume of the larger particles 20 can be ten times greater, i.e. about 30 mm$^3$, distributed thus over a distance of nearly 10 millimetres in the example's sample tube 18. If the particle distribution is 50:50, the bottom is 1.5 mm$^3$ denser and on top of it 15 mm$^3$ larger particles.

The negative sample 14.1 (merely magnetic particles 19) gives with this manner of measurement nearly the same result at each measurement point of the coil arrangement 11. The positive sample 14.3 give a greater result at the wide end of the coil 12 and a smaller result at the narrow end of the coil 12. Though the total number of particles is constant, the denser particle mass causes a larger signal than the same number of particles distributed over a large volume.

By changing, for example, the geometry of the wedge-like coil arrangement 11, it is possible to adjust the distance sensitivity. The effect distance at the narrow end of the coil 12 is shorter than at the wide end of the coil 12. Thus, when measuring at the narrow end of the coil 12, the particles closest to the coil 12 cause a relatively greater signal that the particles farther from the coil 12. Correspondingly, measured at the wide end the total number of particles in the sample can be determined, as there the distance dependence is smaller.

Measurement based on distance sensitivity can be used on the basis of the above to determine the distribution in a sample 14, if the total number of particles in the sample 14 is constant, or if it is determined in some other way. Thus, as the only manner of measurement this may be associated with uncertainty, if there is no certainty as to the number of particles. In the following, some ways of improving the reliability and accuracy of the measurement are presented.

Figure 6:
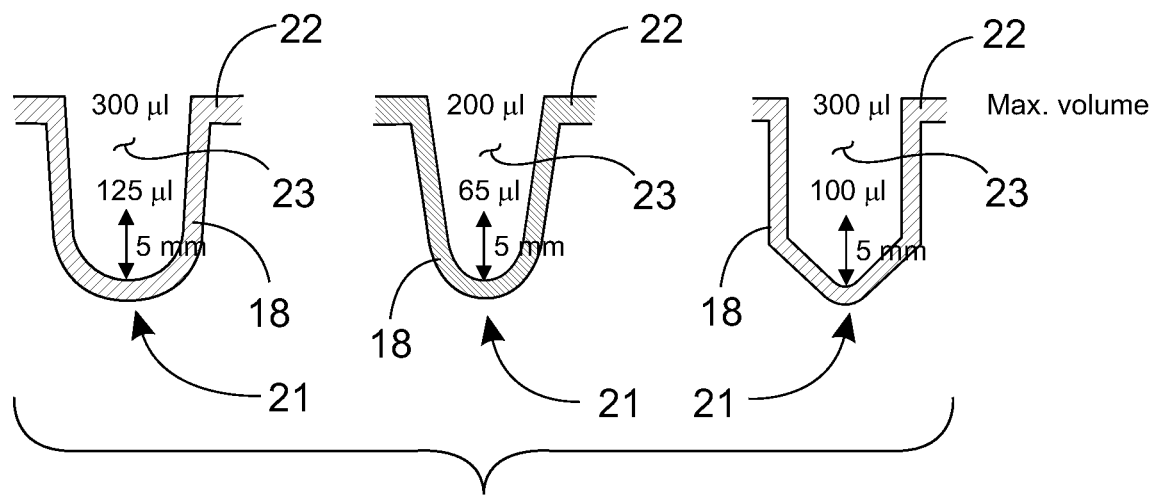
FIG. 6 shows side views of some examples of measurement bases.

A simplified example can be regarded as a situation, in which the sample 14 and the sensor 12 are at a specific angle relative to each other. FIG. 6 shows an example of this. By means of the solution, distance-dependent measurement can be made, even though the movement of the sample 14 takes place on the same plane. When moving the sample 14 over the sensor 12 in the measurement direction M, one edge of the sensor 12 is farther from the sample 14 than the other edge. Because the distance dependence of the sensitivity can be non-linear in constant-distance measurement, particularly at close distances, the distance dependence can be more linear with the aid of this embodiment.

The total number of particles can also be measured without moving the sample, as described in the following embodiments. According to a first embodiment, the total number of particles and the distribution of the particles in the sample can be determined, for example, by exploiting the non-linear distance dependence. In this case, it will thus be sufficient for the sample 14 to be brought, for example, from above into the area of effect of the coil 12 at one measurement point and for the signal level to be measured as the sample 14 approaches the coil 12 from different distances. The sample 14 thus does not move at all in the measurement direction shown by the reference M, but instead in the direction shown by the reference Z.

A second alternative to the determining of the total number of particles is the measurement of a mixed sample, in which case the particles are distributed evenly in the sample. Because the signal level is initially measured from this in a specific volume (in the measurement area of the coil), an estimate is obtained of the mean particle density. If the total volume of the sample is known, the total number of particles can thus be determined. If the particles settle to the bottom in the sample, a measurement result correlating to the distribution is obtained. Because the total number of particles is now determined by measurement, the accuracy of the distribution measurement is improved.

According to a third embodiment, the number of particles can be measured from the settling time of the sample. If the sample is in liquid form, and its properties (including its viscosity) are known, these properties can be exploited to determine the number of particles. The large particles settle on the bottom more slowly than the smaller particles. If an estimate of the distribution is determined on the basis of the settling time, the impedance-measurement result can be used to estimate the total number of particles. By combining these results, the measurement accuracy is again improved.

In some cases, a change in the measurement frequency can also be exploited for determining the particle distribution. For example, when using electrically conductive samples, an increase in the measurement frequency reduces the penetration depth of the magnetic field, so that this can be exploited to some extent correspondingly to the change in the coil's geometry. If the size or structure of the clusters of super-paramagnetic particles differ from each other, the different frequency behaviours of the different particles can be seen from frequency scanning. Thus, by means of a frequency change, particles of a different size can be separated from the same sample.

FIG. 6 shows examples of a few common measurement bases 18, which are now sample wells with a maximum volume and a sample volume, in which case the layer thickness in the sample well 18 of the substance to be analysed is 5 mm. From left to right, the maximum volumes of the sample wells 18 are 300 µl, 200 µl, and 300 µl. In corresponding order, the sample volumes, which form a 5-mm layer on the bottom of the sample space 23 of the sample wells 18 are 125 µl, 65 µl, and 100 µl. When performing measurement, the bottoms 21 of the sample wells 18 are against the coil arrangement 11. There can be a neck 22 in the upper part of the sample wells 18, which can be utilized, for example, when carrying the sample well 18 in a holder.

Figure 8:
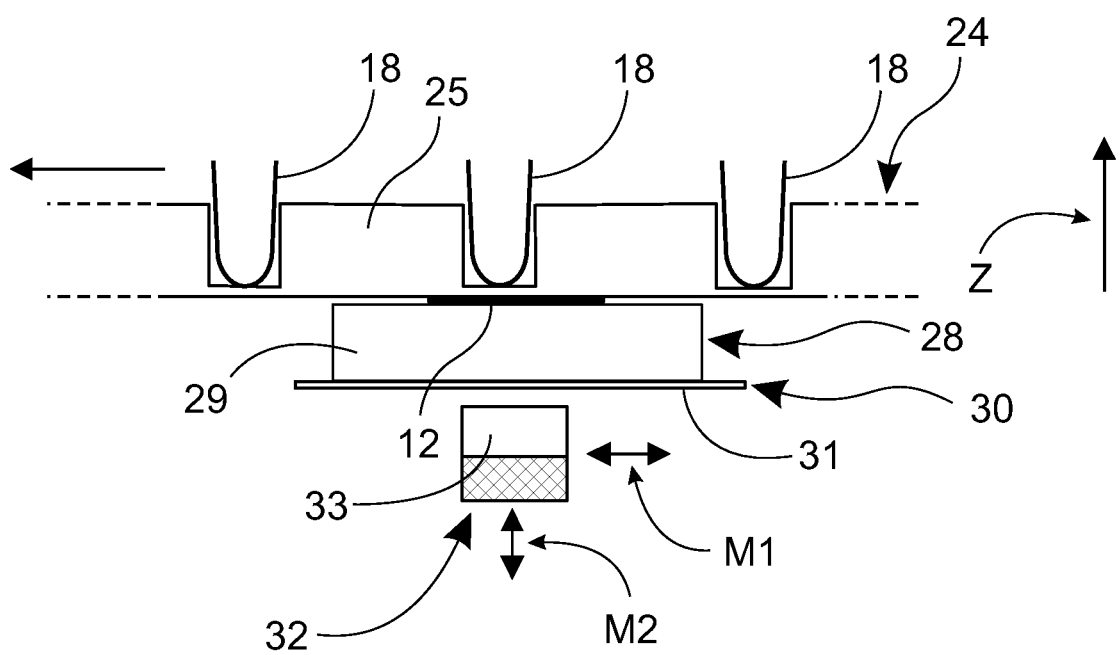
FIG. 8 shows the example shown in FIG. 7 of the arrangement of samples in connection with the coil arrangement, seen from the side.

FIGS. 7 and 8 show one schematic example of an application for arranging samples 14 in connection with a coil arrangement 11. FIG. 7 shows the application example in a top view and FIG. 8 in a side view. According to one embodiment, the means 24 for changing the position of the sample 14 and the coil arrangement 11 relative to each other can include a holder 25 for at least one sample 14, to be fitted in connection with the coil arrangement 11. The holder 25 can be, for example a circular disc arranged to rotate around its centre point, in which there can several places 26 for samples 14. A stepper motor 34 can be connected to the disc 25, for example to its centre, for rotating it under computer control. The rotational movement of the disc 25 is arranged to create a changing position relative to the coil arrangement 11 for the sample 14 fitted to the holder 24. In addition, by means of the rotational movement of the disc 25 it is possible to examine several samples 14, without always having to change a new sample in the holder 24 after examining one sample. Thus the disc 25 can move in a stepped manner.

The places 26 for the samples 14 can be, for example, holes or recesses arranged consecutively circumferentially on the outer circumference of the disc 25. In these, the sample 14 remains in place in the desired attitude. The distance of the places from each other and the size of the disc 25 can be arranged in such a way that there is only one sample 14 at a time in each measuring position of the disc 25 in the area of effect of the coil 12. In addition, there can also be a point-like calibration sample 27 in the disc 25.

FIG. 8 shows yet another embodiment of the arrangement 10, which can equally be applied in all the other embodiments already presented above, and which is also not limited to the disc-like holder presented in connection with this embodiment. Here, beneath the coil 12, which is now on the opposite side of the coil 12 relative to the locations of the samples 12, an arrangement 28, 30, 32 is arranged for affecting the magnetic particles 19, 20 belonging to the sample 14, without, however, disturbing the measurement performed by the coil 12.

According to one embodiment, the arrangement includes, for example, an insulating layer 28 below the coil 12. The insulating layer 28 can be, for example, of plastic 29 or an intermediate layer of the circuit board 17. Alternatively, there can be a layer under the coil 12 guiding the magnetic flow of the coil 12. It can be, for example, of ferrite. There can, in turn, be a conducting layer 30 under the layer 28. The conducting layer 30 can be formed, for example of copper 31 or aluminium. The conducting layer 30 is impenetrable to the high-frequency magnetic field of the measuring coil 12.

Further, behind the conducting layer 30 there can be means 32 for affecting the sample 14 and particularly the magnetic particles in it. The means 32 can include, for example, a permanent magnet 33. The sample 14 and the permanent magnet 33 below the coil 12 can remain at a constant distance from each other during the measuring event. By means of the permanent magnet 33, a static magnetic field is created, which attracts the particles in the sample 14 close to the measuring coil 12 and which thus penetrates the conductive layer 30. The magnetic field is made sufficiently homogeneous for the sample 14 to be moved horizontally.

The magnet 33 can be moved in the direction M1 and/or M2, i.e. in the plane direction M of the coil arrangement 11, and also in the direction Z perpendicular to this. The magnet 33 or its movement does not affect the measurement signal formed from the sample 14 by the coil 12, because the conducting layer 30 remains in the same position relative to the coil 12. The magnet 33 can also be powerful. Equally, the arrangement can also be installed, for instance, above the sample 14 (on the side of the mouth of the measurement base 18). Again, there can be a conducting layer 30 between the magnet 33 and the coil 12.

By means of the insulating piece 28, a constant distance can be created between the coil 12 acting as a sensor and the conducting layer 30 that blocks its high-frequency magnet field. By means of the solution, any piece whatever can be added to the other side of the conducting layer 30, without affecting the measurement signal created by the coil 12. The piece is now a powerful permanent magnet 33. Equally, it can also be an electromagnet. In that case, the conducting layer 30 may not necessarily be required at all, particularly if the permanent magnet 33 or the coil remain the whole time at a constant distance. The conducting layer 30 thus permits the magnet 33 or some other metal to be moved on its other side. If the magnet 33 or, for example, the coil do not move, the conducting layer 30 that blocks the high-frequency field may not necessarily be required. Due to the insulating layer 28, for its part, the permanent magnet 33 does not affect the electrical properties of the coil 12. It can then be changed, moved, or removed, without affecting the measurement result or the calibration.

The advantage of this embodiment is that, with the aid of the arrangement, the magnetic particles or the substances bound to them can, for example, be pulled in the measurement base 18 towards the coil 12, or alternatively be drawn away from the coil 12 depending on the application. In general, one can speak of magnetic separation. Through the arrangement, the force pulling the particles in the sample 14 is constant during the measurement event. In addition, the movement of the magnet 33 relative to the measuring coil 12 does not induce a change in the electrical properties of the coil 12. In other words, this embodiment permits the use of a static magnetic field to precipitate the particles, without it affecting the actual performance of the measurement by the coil 12.

Figure 9:
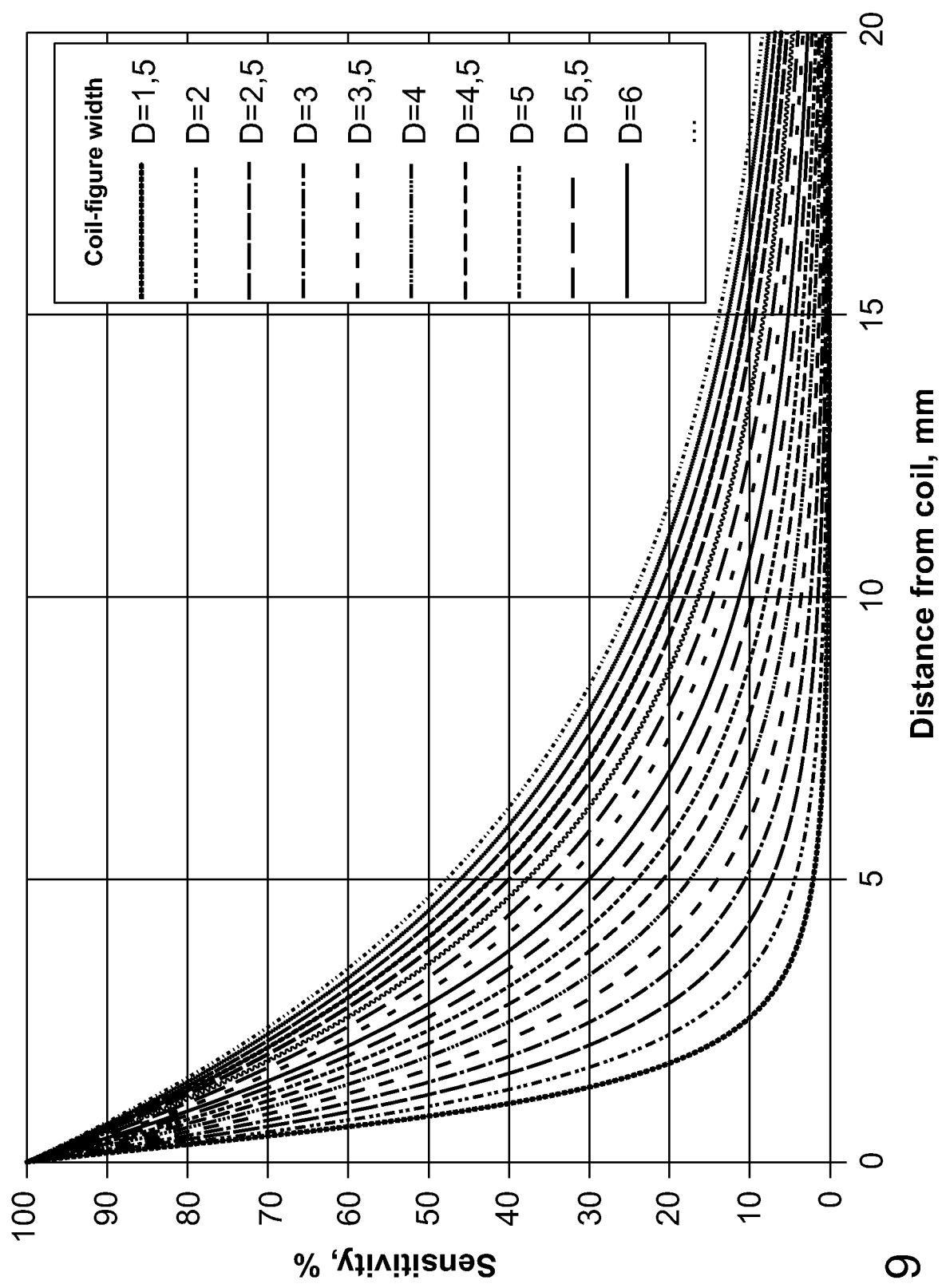
FIG. 9 shows the sensitivity of one coil arrangement as a function of distance.
Figure 10:
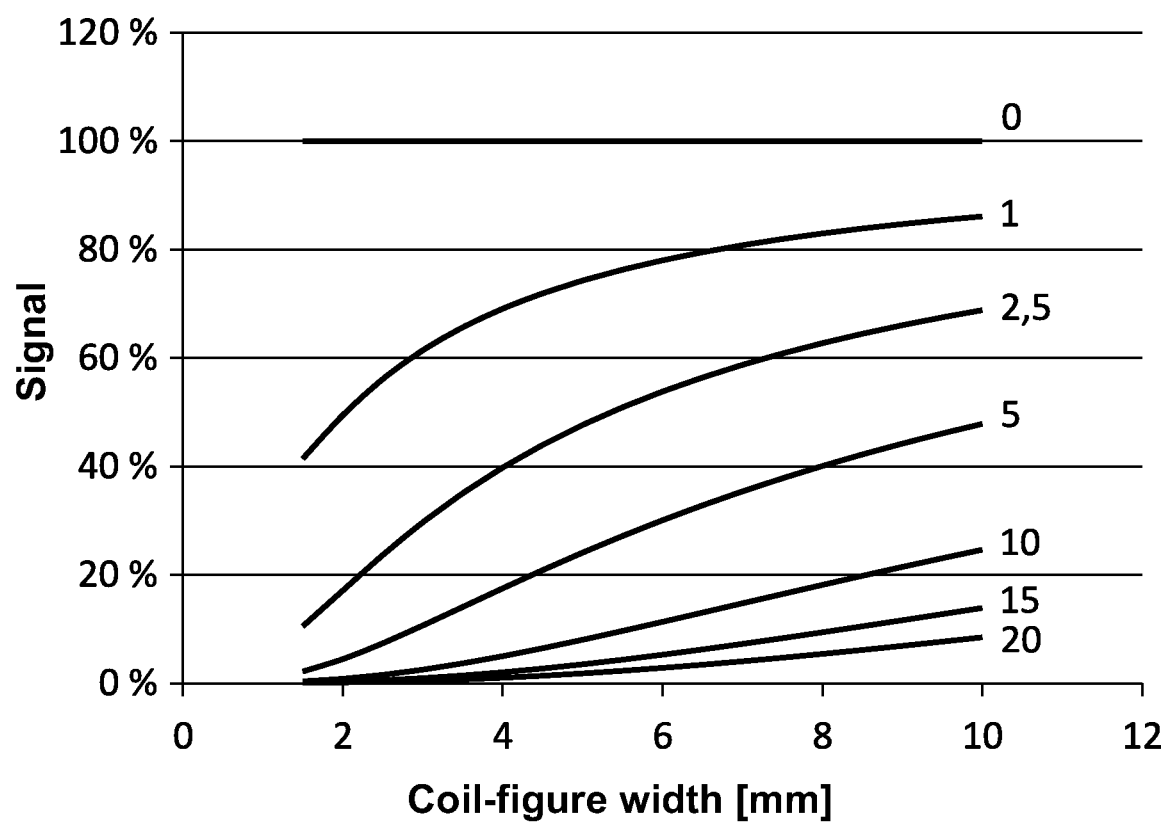
FIG. 10 shows the behaviour of particles at different distances from the coil arrangement, as function of the diameter of the coil geometry.

The following describes the simplified operating principle of the measuring arrangement 10 according to the invention, with reference to FIGS. 9 and 10. A wedge-like flat coil (for example, FIG. 1b) is used as an example of the coil arrangement in this case. Its coil figure, i.e. coil geometry, can change from a width of 1.5 mm to a width of 10 mm in the measurement direction M, which in this case is also the direction K of the characteristic plane defined by the flat coil 12. FIG. 9 shows the sensitivity of the coil arrangement schematically as a function of distance. The distance-sensitivity curves are shown for selected measurement points, which correspond to the width of the coil figure at each measurement point.

In this case, the measurement points can start from a point in the measurement direction M, at which the width of the coil figure is 1.5 mm and from which they increase at an interval of 0.5 mm in the measurement direction M. The legend of FIG. 9 does not show the corresponding coil figure's width at each measurement point, instead they terminate at a point, at which the width of the coil figure is 6 mm. In the curve of FIG. 9, more of these are shown at the same 0.5 interval up to a point corresponding to a width of 10 mm.

By means of a point-like calibration sample touched to the coil, the sensitivity of each measurement point in the measurement direction M is set as 100%. Each measurement point has its own coefficient, by which the change in inductance is rated. If the point-like object touching the coil is measured, the same result is obtained at each measurement point. If the distance of the object is something else, a different result is obtained at each measurement point.

If the same sample gives the same result at all of the measurement points (i.e. the different widths of the coil), the sample is touching the coil. If, on the other hand, the result drops by 96% when moving from the point corresponding to a coil width of 10 mm to a point corresponding to a coil width of 1.5 mm, the distance of the point-like sample from the surface of the coil is 5 mm. On the basis of this information, the actual number of particles can also be calculated, because the sensitivity of the coil at that distance is known.

Different behaviours are obtained for the particles at different distances from the coil arrangement as a function of the coil's coil geometry (in this case, the width of the coil figure). FIG. 10 shows the behaviour of the particles at different distance as a function of the coil geometry (width of the coil figure). The curve shows point-like particles at distances of 0, 1, 2.5, 5, 10, 15, and 20 mm from the surface of the coil.

Once the corresponding known curves are known, it is possible to inversely also determine the particle distribution of the measured curve. At its simplest, for instance, in such a way that several different functions are fitted to the measured function by means of various weighting factors. After the fitting, the particle distribution can be seen from the weighting factors of the functions.

FIG. 11 shows one schematic example, as a block diagram, of the measuring circuit, i.e. the measuring electronics 13, 16 which can be applied in the measuring arrangement 10 and method according to the invention. It will be obvious to one skilled in the art that the electronics 13, 16 shown in it is not intended to restrict the basic idea of the invention, but that it is only intended as a kind of point example, by means of which measurements according to the invention can be implemented by the measuring arrangement 10 and according to the method. In this embodiment, the coil arrangement, which includes one flat coil 12, is shown as part of an impedance bridge 45. Again, the coil geometry of the flat coil 12 is arranged to change in the direction K of the plane defined by the coil arrangement, i.e. in this case the flat coil 12 belonging to it.

The first amplifier stage 35 shown in FIG. 11 can be, for example, a low-noise, (LNA) broadband differential amplifier. After the amplifier 35 there can be quadrature demodulation, for example, in order to eliminate low-frequency noise and 50-Hz disturbance, as well as to permit phase-difference measurements.

The quadrature demodulation can be implemented, for example, by means of mixers 36, 37 (MIXERS) by mixing the output signal 38 with the sine of the input signal (In phase, I) formed by the DDS oscillator 39 and the cosine (Quadrature, Q) formed by the DDS oscillator 41. The outputs of the I and Q mixers 36, are filtered by low-pass filters 42.1, 42.2 (FILTERS), amplified, and fed to the ADCs 43. On the driver side 13, there can, in turn, be an input amplifier 40 (PA) between the bridge 45 and the DDS oscillator 39.

In order to reduce the noise level and prevent leakage between the modules the electronics 13, 16 can include the necessary protections and input-filterings. In addition, each main module can have its own regulator (not shown).

In the concept according to the invention, the output signal should be understood, for example, as the raw signal measured directly from the bridge 45, or the raw signal, which is manipulated in an, as such, known manner in order to permit measurement. Due to the non-idealities of the bridge 45, the output signal generally has an offset. The offset can be removed, for example, by using a calibration signal. Other signal manipulations will also be obvious to one skilled in the art, without, however, altering in any way the basic idea of the invention itself.

Some examples of applications of the invention can be diagnostics in human and veterinary medicine, foodstuff and environmental technology, without, however, excluding other areas of application not mentioned in this connection. Thus the invention also relates to the use of the measuring arrangement 10, for example, in diagnostics and analytics.

In addition to the measuring arrangement, one aspect of the invention can also be a device 12, for the measuring arrangement 10. The device is, for example, the flat coil 12 shown in FIG. 1 or 3, which has a coil geometry. The coil geometry of the flat coil 12 is arranged to be changed in the direction K of the characteristic plane defined by the flat coil 12.

Further, the invention also relates to a method for measuring a sample 14. In the method, the sample 14 is measured using a coil arrangement 11. In connection with the measurement, a change in the impedance of the coil arrangement 11 is detected. On its basis, the qualitative and/or quantitative properties of the sample 14 are determined. In the method, the coil arrangement 11 is formed from at least one flat coil 12. The flat coil 12 forms the coil geometry for the coil arrangement 11. In addition, in the method the coil geometry of the coil arrangement 11 is arranged to change in the direction K defined by the coil arrangement 11. The intention of this is to form a spatially changed magnetic field B for the measurement of the sample 14. In addition, in the method the position of the sample 14 and the coil arrangement 11 relative to each other is also changed. This change in position relative to each other takes place in order to change the magnetic field B affecting the sample 14. According to one embodiment, the sample 14 is moved over the coil arrangement 11 in the direction of the plane in the direction in which the magnetic field B changes spatially in a set manner.

According to one embodiment, in the method the coil geometry of at least one flat coil 12 belonging to the coil arrangement 11 is arranged to be asymmetrical relative to the line P perpendicular to the direction K of the plane defined by the coil arrangement 11.

According to one embodiment, the position of the sample 14 and the coil arrangement 11 relative to each other is changed in the method in the direction K of the plane defined by the coil arrangement 11.

According to one embodiment, when changing the position of the sample 14 and the coil arrangement 11 relative to each other in the method, the location of the sample 14 is defined relative to the coil arrangement 11.

Yet another object of the invention is a device, which includes at least one measuring arrangement 10, which can be, for example, according to any of the embodiments described above, or a combination of them. The device includes, in addition, an interface for connecting the device, for example, to the data-processing apparatus or system of a hospital or laboratory. Thus, the measuring arrangement 10 according to the invention can be part of a larger totality, such as, for example, a laboratory analyser.

It must be understood that the above description and the related figures are only intended to illustrate the present invention. The invention is thus in no way restricted to only the embodiments disclosed or stated in the Claims, but many different variations and adaptations of the invention, which are possible within the scope on the inventive idea defined in the accompanying claims, will be obvious to one skilled in the art.

The invention claimed is:

1. A measuring arrangement, comprising:
   a flat coil arrangement for creating a magnetic field to measure a sample in a measurement base arranged to be moved in a measurement direction across the flat coil arrangement, the flat coil arrangement consisting of one or more coils defining a plane, wherein the flat coil arrangement has a flat coil geometry to create, in the measurement direction, a magnetic field changing spatially in a direction perpendicular to the plane defined by the flat coil arrangement and having a known distance dependence from the plane of the flat coil arrangement, wherein the flat coil geometry of the flat coil arrangement is asymmetric relative to a line in a centre of the flat coil arrangement perpendicular to the measurement direction in the plane defined by the flat coil arrangement;
   means for moving the measurement base in the measurement direction through the spatially changing magnetic field in order to change the magnetic field affecting the sample during a measurement of the sample; and
   electronics connected to the flat coil arrangement 1) for causing the flat coil arrangement to generate the magnetic field and 2) for measuring changes in the electrical properties of the flat coil arrangement caused by moving the measurement base with the sample in the magnetic field generated by the flat coil arrangement, wherein the measured changes in the electrical properties of the flat coil arrangement relate to at least one of qualitative and quantitative properties of the sample.

2. The measuring arrangement according to claim 1, wherein a position of the sample and the flat coil arrangement relative to each other is arranged to be changeable in the direction of the plane defined by the flat coil arrangement.

3. The measuring arrangement according to claim 1, wherein the arrangement further comprises means for determining a location of the sample relative to the flat coil arrangement.

4. The measuring arrangement according to claim 1, wherein the flat coil geometry of at least one of the one or more flat coils is triangular.

5. The measuring arrangement according to claim 1, wherein the means for moving comprises a holder, to be fitted in connection with the flat coil arrangement for at least one sample, a rotational movement of which is arranged to create a changing position, relative to the flat coil arrangement, for the sample fitted to the holder.

6. The measuring arrangement according to claim 1, wherein the electronics comprise means for reading the sample, which are arranged to be formed from at least partly the same electronics, by means of which the magnetic field is arranged to be created by the flat coil arrangement.

7. The measuring arrangement according to claim 1, wherein the arrangement further comprises an arrangement for affecting magnetic particles belonging to the sample.

8. The measuring arrangement according to claim 7, wherein the arrangement for affecting magnetic particles belonging to the sample comprises:

an insulating layer; and a conducting layer; and means for affecting magnetic particles belonging to the sample.

9. The measuring arrangement according to claim 1, wherein the sample is arranged in a cuvette.

10. The measuring arrangement according to claim 1, wherein the means for moving the measurement base comprises:
a holder, for at least one sample, to be fitted in connection with the flat coil arrangement; and
an operating device for moving the holder relative to the flat coil arrangement.

11. The measuring arrangement according to claim 10, wherein
the holder is a disc arranged to rotate around centre point of the disc, in which are arranged several places for samples; and
the operating device comprises a stepper motor connected to the disc for rotating the disc under computer control.

12. The measuring arrangement according to claim 11, wherein the places arranged in the disc for the samples comprise holes or recesses arranged in the disc consecutively and circumferentially.

13. The measuring arrangement according to claim 11, wherein the places are spaced a distance from each other and the disc has a size such that one sample at a time is arranged in each measurement position of the disc in an area of effect of the flat coil arrangement.

14. The measuring arrangement according to claim 11, wherein the disc comprises a calibration sample.

15. A method for measuring a sample using the measuring arrangement according to claim 1, comprising steps of:
measuring, with the electronics, the sample using the flat coil arrangement by changing a position of the sample and the flat coil arrangement relative to each other in order to change the magnetic field acting on the sample and having the known distance dependence; and
wherein the electronics includes means for detecting a change in impedance of the flat coil arrangement, and the method includes detecting a change in impedance of the flat coil arrangement.

16. The method according to claim 15, further comprising changing the position of the sample and the flat coil arrangement relative to each other in the direction of the plane defined by the flat coil arrangement.

17. The method according to claim 15, wherein, when changing the position of the sample and the flat coil arrangement relative to each other, the location of the sample is defined relative to the flat coil arrangement.

18. A method of analysing a sample comprising utilizing the measuring arrangement according to claim 1.

19. A device, comprising:
at least one measuring arrangement according to claim 1; and
an interface for connecting the at least one measuring arrangement to a data-processing apparatus.

* * * * *